(12) United States Patent
Talledo et al.

(10) Patent No.: US 9,578,744 B2
(45) Date of Patent: Feb. 21, 2017

(54) LEADFRAME PACKAGE WITH PRE-APPLIED FILLER MATERIAL

(71) Applicant: STMicroelectronics, Inc., Laguna (PH)

(72) Inventors: Jefferson Talledo, Laguna (PH); Frederick Ray Gomez, Iligan (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 14/579,902

(22) Filed: Dec. 22, 2014

(65) Prior Publication Data

US 2016/0183369 A1  Jun. 23, 2016

(51) Int. Cl.

| H01L 23/495 | (2006.01) |
|---|---|
| H01L 23/02 | (2006.01) |
| H01L 23/48 | (2006.01) |
| H01L 23/52 | (2006.01) |
| H05K 1/11 | (2006.01) |
| H01L 23/00 | (2006.01) |
| H05K 1/18 | (2006.01) |
| H01L 23/31 | (2006.01) |
| H01L 21/56 | (2006.01) |

(52) U.S. Cl.
CPC ......... *H05K 1/111* (2013.01); *H01L 23/49548* (2013.01); *H01L 23/49582* (2013.01); *H01L 24/83* (2013.01); *H05K 1/181* (2013.01); *H01L 21/561* (2013.01); *H01L 21/568* (2013.01); *H01L 23/3107* (2013.01); *H01L 2224/97* (2013.01); *H01L 2924/014* (2013.01); *H05K 2201/10628* (2013.01); *H05K 2201/10992* (2013.01)

(58) Field of Classification Search
CPC ............ H01L 2224/48247; H01L 2224/48091; H01L 2924/01079; H01L 2924/01029; H01L 2924/15311; H01L 27/14618; H01L 2924/14; H01L 2924/01013
USPC ........ 257/666, 673, 698, 680, 690, 692, 784
See application file for complete search history.

(56) References Cited

U.S. PATENT DOCUMENTS

| 6,608,366 | B1 | 8/2003 | Fogelson et al. |
|---|---|---|---|
| 7,397,112 | B2 * | 7/2008 | Sato .................. H01L 23/49548 257/666 |
| 2007/0095471 | A1 * | 5/2007 | Ito et al. ....................... 156/293 |

FOREIGN PATENT DOCUMENTS

JP    2000-294719 A    10/2000

OTHER PUBLICATIONS

Real et al., "Leadframe Package With Wettable Sides and Method of Manufacturing Same," U.S. Appl. No. 14/207,975, filed Sep. 16, 2013, 29 pages.

* cited by examiner

*Primary Examiner* — A. Sefer
*Assistant Examiner* — Dilinh Nguyen
(74) *Attorney, Agent, or Firm* — Seed IP Law Group LLP

(57) ABSTRACT

Embodiments of the present disclosure are directed to a leadframe package with recesses formed in outer surface of the leads. The recesses are filled with a filler material, such as solder. The filler material in the recesses provides a wetable surface for filler material, such as solder, to adhere to during mounting of the package to another device, such as a printed circuit board (PCB). This enables strong solder joints between the leads of the package and the PCB. It also enables improved visual inspection of the solder joints after the package has been mounted.

20 Claims, 11 Drawing Sheets

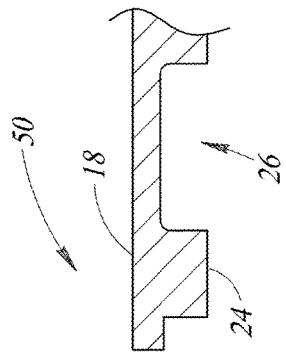
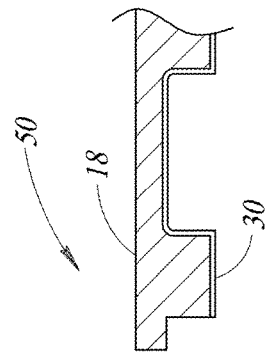
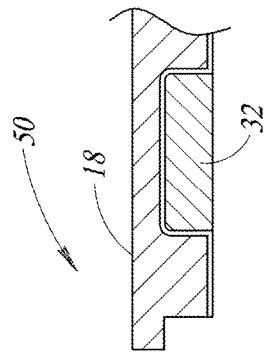
FIG.4A
FIG.4B
FIG.4C
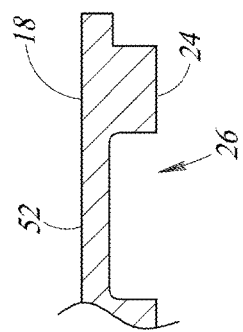
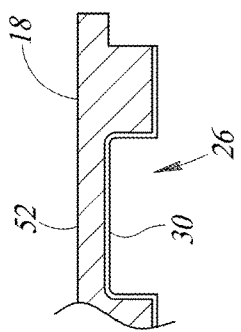
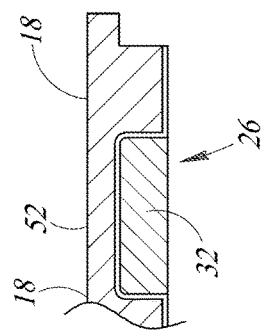

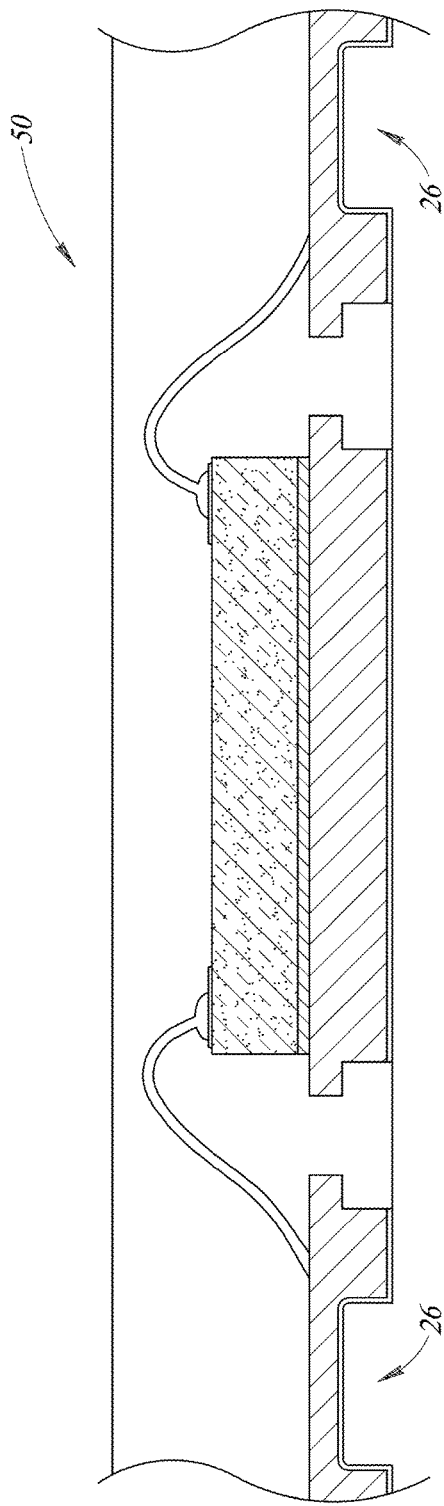
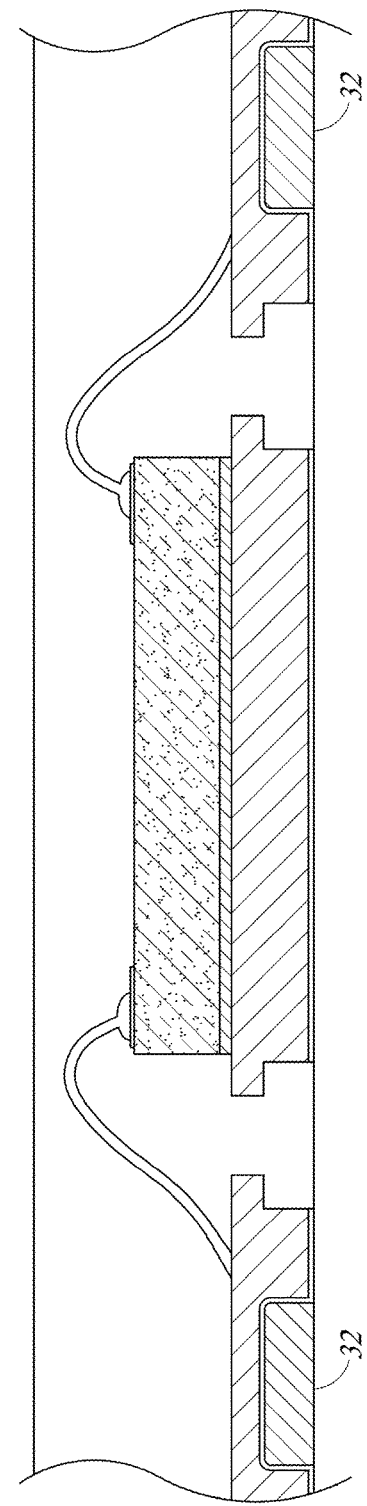
FIG.5C
FIG.5D

LEADFRAME PACKAGE WITH PRE-APPLIED FILLER MATERIAL

BACKGROUND

Technical Field

Embodiments of the present disclosure are directed to leadframe strips and leadless packages, as well as methods of manufacturing leadframe strips and assembling leadless packages.

Description of the Related Art

Leadless (or no lead) packages are often utilized in applications in which small sized packages are desired. In general, flat leadless packages provide a near chip scale encapsulated package that includes a planar leadframe. Lands (also referred to as leads) located on a bottom surface of the package and, in many cases, side surfaces of the package provide electrical connection to a substrate, such as a printed circuit board (PCB). The packages are mounted directly on the surface of the PCB using surface mount technology (SMT).

Although SMT allows for smaller packages, it also creates some disadvantages. In particular, the solder joints between the package and the PCB can be weakened due to the PCB and the package having different coefficients of thermal expansions (CTE). Thus, the reliability of the package may, in some cases, depend on the integrity of the solder joints.

As packages reduce in size, the available space for solder joints is further limited. Thus, strong solder bonds between the lands of the package and the pads of the board are desired.

BRIEF SUMMARY

Embodiments of the present disclosure are directed to a leadframe package with recesses formed in outer surface of the leads. The recesses are filled with a filler material, such as solder. The filler material in the recesses provides a wetable surface for filler material, such as solder, to adhere to during mounting of the package to another device, such as a printed circuit board (PCB). This enables strong solder joints between the leads of the package and the PCB. It also enables improved visual inspection of the solder joints after the package has been mounted.

BRIEF DESCRIPTION OF THE SEVERAL VIEWS OF THE DRAWINGS

FIGS. 4A-4F are cross-sectional views illustrating the packages of FIG. 1 being assembled at various stages of manufacture in accordance with one embodiment.

FIGS. 5A-5E are cross-sectional views illustrating the packages of FIG. 1 being assembled at various stages of manufacture in accordance with one embodiment.

DETAILED DESCRIPTION

Figure 1A:
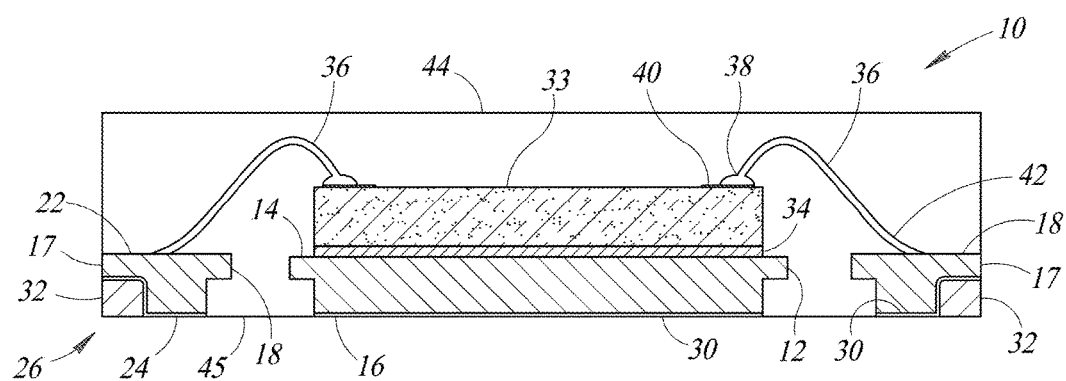
FIG. 1A is a schematic illustration of a cross-sectional view of a semiconductor package in accordance with one embodiment.

FIG. 1A shows a cross-sectional view of a leadframe package 10 made in accordance with one embodiment of the disclosure. The package 10 shows a die pad 12 and two leads 18 located spaced apart from and on opposing sides of the die pad 12. The die pad 12 has upper and lower surfaces 14, 16 and the leads 18 have upper and lower surfaces 22, 24. The lower surfaces 24 of the leads 18 may also be referred to as lands of the package 10. The die pad 12 and the leads 18 are made of a conductive material, such as copper or a copper alloy.

Figure 1B:
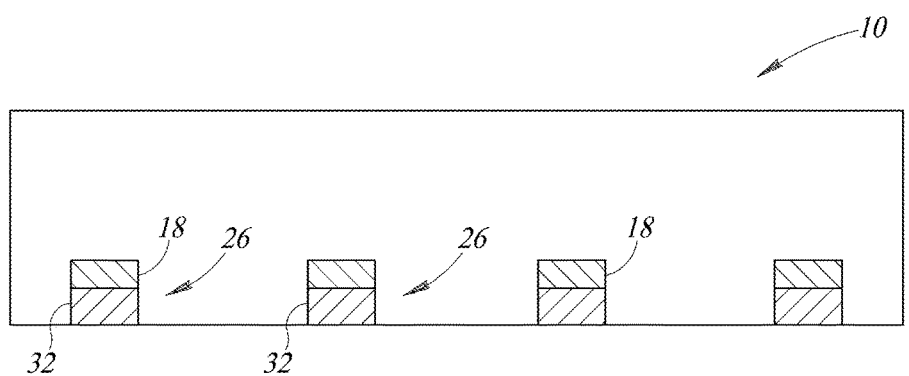
FIG. 1B is a side view of the package of FIG. 1.

FIG. 1B shows a side view of the package 10. As shown by the side view, the package includes four leads 18 on one side. It is to be appreciated, however, that any number of leads may be included in the package including one lead on just one side of the die pad 12. In some embodiments, the leads are provided on two sides or four sides of the die pad.

An outer surface 17 and the lower surface 24 of the leads 18 have respective recesses 26 formed therein. The recesses 26 may be any shape. In the illustrated embodiment, the recesses 26 are rectangular shaped. As best shown in FIG. 1B, the recess 26 extend across an entire width of the respective lead 18. In other embodiments, however, a portion of the lead may form side surfaces around the recess. That is, the recess may be U-shaped as viewed from the side of the package. The recesses 26 may have any lateral or vertical depths. In the illustrated embodiment, the recesses extend about halfway or just over halfway through a thickness of the leads 18 and less than halfway in the lateral direction.

The lower surface 16 of the die pad 12, the lower surface of the leads 18, and the recesses 26 may have a conductive layer 30 thereon. The conductive material may be any conductive material that encourages a filler material, such as solder, to adhere to the lead 18. The conductive layer 30 may be a nanolayer or microlayer of one or more conductive materials. For instance, the upper and lower surfaces 14, 16 of the die pad 12 and the upper and lower surfaces 22, 24 of the leads 18 may be plated with one or more metal materials, such as Au, Ag, Ni/Pd/Ag, Ni/Pd/Au—Ag alloy, or Ni/Pd/Au/Ag.

A filler material 32 is located in the recesses 26 of the leads 18. The filler material 32 may be any conductive material with a melting point that is equal to or less than the materials being joined, such as between the conductive layer 30 or the lead 18 and a pad on a printed circuit board (PCB) 46 (FIG. 2). In some embodiments, the filler material 32 is solder material. For instance, in some embodiments, the solder material is Ag or a Sn composition, such as Sn/Pb alloy, Sn/Bi alloy, Cu/Sn alloy, or the like.

In the illustrated embodiment, the filler material 32 fills the recess 26. The filler material 32 has a side surface that is substantially planar with the outer surface 17 of the lead 18 and a bottom surface that is substantially planar with the lower surface 16 of the die pad 12.

Referring again to FIG. 1A, the package 10 further includes a semiconductor die 33 coupled to the upper surface 14 of the die pad 12 by an adhesive material 34. The semiconductor die 33 is any semiconductor die configured to send and/or receive electrical signals. For instance, the semiconductor die may be an integrated circuit, microelectromechanical sensor (MEMS), and any other electronic chip. The adhesive material 34 may be any material configured to hold the semiconductor die 33 in place during the assembly process. The adhesive material 34 may be double sided tape, epoxy, glue, or any suitable material for adhering the die 33 to the upper surface 14 of the die pad 12.

The semiconductor die 33 includes conductive pads 40 that are electrically connected to one or more electrical circuits formed in the semiconductor die 33, as is well known in the art. Conductive wires 36 electrically couple the semiconductor die 33 to the leads 18. For instance, a first end 38 of the conductive wire 36 is coupled to a bond pad 40 of the die 33 and a second end 42 of the conductive wire 36 is coupled to the first lead 18.

Encapsulation material 44 is located over the die pad 12 and the leads 18 enclosing the die 33 and the conductive wires 36. The encapsulation material 44 is also located between the leads 18 and the die pad 12 and forms a bottom surface 45 therebetween. The outer surface 17 of the leads 18 and the filler material 32 form outer surfaces of the package 10, along with the encapsulation material 44. The encapsulation material 44 may be any material configured to provide protection from environmental sources of damage, such as corrosion, physical damage, moisture damage, or other causes of damage to electrical devices. The encapsulation material 44 may be a molding compound that includes one or more of polymer, polyurethane, acrylic, epoxy resin, silicone, or any other suitable material.

Figure 2A:
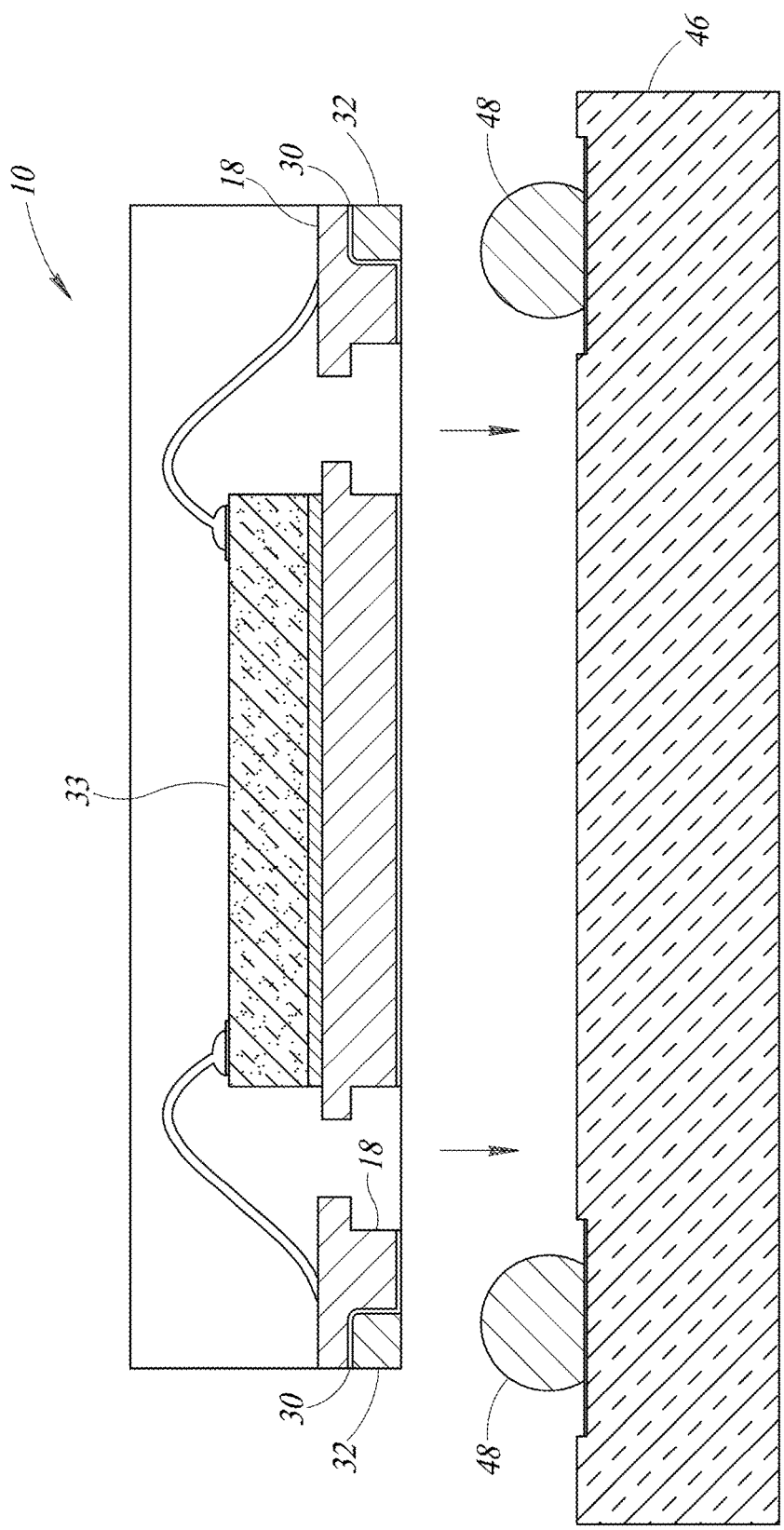
FIGS. 2A and 2B are cross-sectional views illustrating stages of mounting the package of FIG. 1 to a substrate in accordance with one embodiment.
Figure 2B:
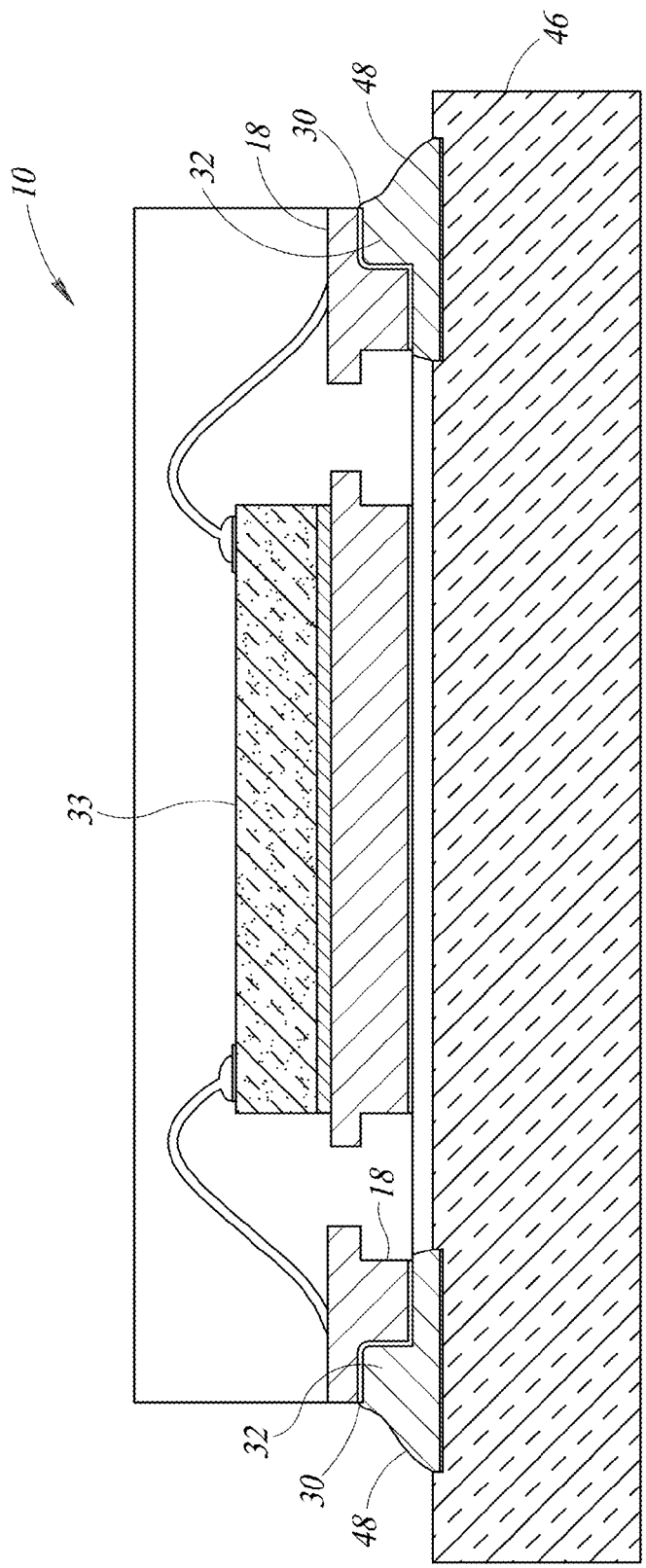

FIGS. 2A and 2B show the process of the package 10 of FIG. 1 mounted to a board, such as printed circuit board (PCB) 46, in accordance with one embodiment. As shown in FIG. 2A, conductive bumps 48, such as solder bumps, are formed on the pads of the PCB using standard assembly processing techniques.

The conductive bumps 48 are formed from any material having a melting temperature that is less than the melting temperature of the pads of the PCB 46 and the leads 18. In some embodiments, the conductive bumps have a melting temperature that is about the same as or less than the filler material 32 in the recesses 26 of the leads 18. The conductive bumps 48 may be any one of the materials recited above in reference to filler material 32, however, the conductive bumps 48 may be the same as the filler material 32 or may be a different material.

The package 10 is electrically and mechanically coupled to pads of a substrate, such as a PCB 46, by the conductive bumps 48 as best shown in FIG. 2B. The PCB 46 is made of one or more layers of insulative materials and conductive material including conductive traces, pads as is well known in the art. It is to be appreciated that in some embodiments, the conductive bumps are formed on the leads 18 of the package 10.

In the illustrated embodiment, the leads 18 of the package 10 are placed on to the conductive bumps 48 on the pads of the PCB. The conductive bumps 48 are melted, such as in a reflow step, attaching the package 10 to the PCB 46. During reflow, the filler material 32 also melts, thereby improving the electrical and mechanical connection between the package 10 and the PCB 46.

Placing filler material 32 in the recesses 26 of the leads 18 prior to the mounting the package 10 on the board 46 provides many advantages. For instance, by filling the recesses 26 with the filler material 32 prior the mounting process, the filler material 32 is more likely to readily fill the recesses 26, thereby eliminating or at least reducing voids in the recesses 26. In that regard, the joint between the package 10 and the PCB 46 may be made stronger than if the recess is filled during the mounting process.

The filler material 32 in the recess 26 provides a wetable surface, such as side surface 51, that enables the conductive bumps 48 to flow along during the mounting process. That is, the conductive bumps 48 moves upward along the side surface 51 of the filler material 32 in the recess 26. In that regard, the conductive bumps 48 provide ease of visual inspection of the joint between the package 10 and PCB 46. Furthermore, the filler materials 32 and conductive bumps 48 together have more surface area that is used to bond the package 10 to the PCB 46 than when the recesses are filled during board attach.

In addition, by applying the filler material 32 prior to the mounting step, the leads 18, at least the portion of the leads in the recesses 26, may be protected from oxidation thereby improving the electrical coupling between the leads 18 of the package 10 and pads of a PCB 46.

Figure 3A:
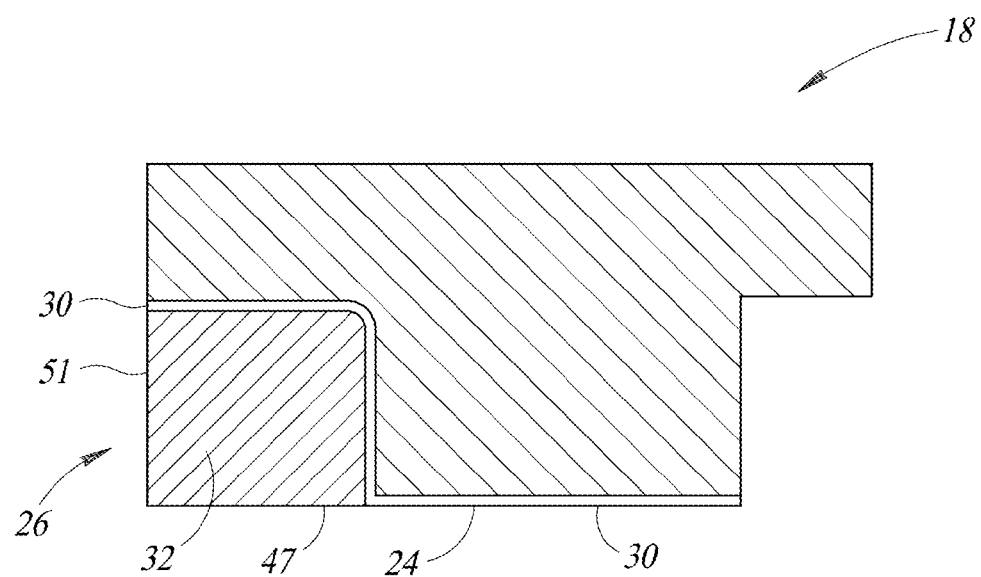
FIGS. 3A-3D are cross-sectional views of leads of a semiconductor package in close up view in accordance with various embodiments.

FIG. 3A shows one of the leads 18 of FIG. 1 in close up view of a recess 26 lined with the conductive layer 30 and filled with the filler material 32. A lower surface 47 of the filler material 32 is coplanar with the lower surface 24 of the lead 18. A side surface 51 of the filler material 32 is coplanar with the outer surface 17 of the lead 18.

Figure 3B:
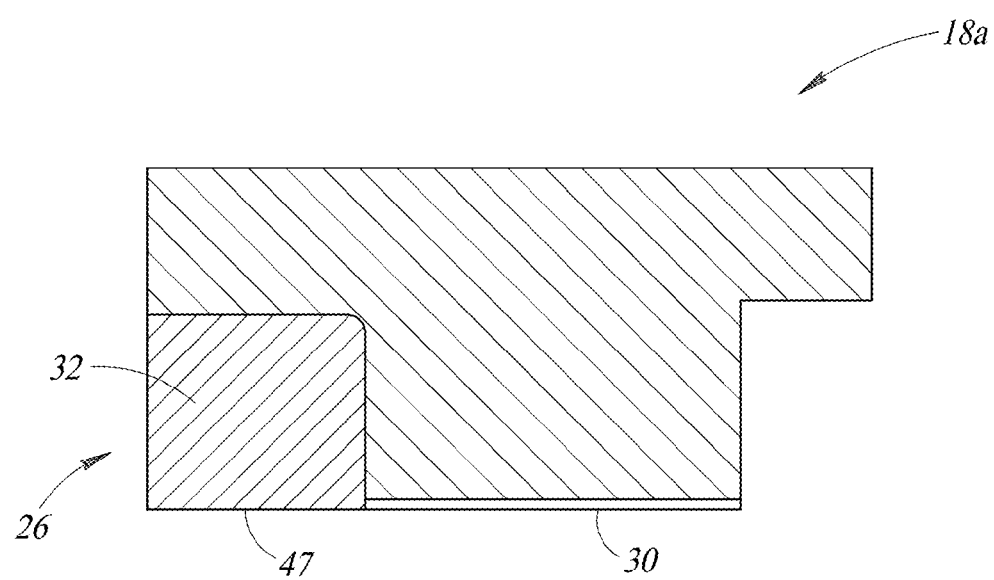

FIG. 3B illustrates a lead 18a that can be used in the package 10 of FIG. 1, in accordance with another embodiment. The lead 18a is substantially identical in function and structure to the lead 18 of FIG. 3A, except that the lead 18a of FIG. 3B does not include the conductive layer 30 inside of the recess 26. In this embodiment, the filler material 32 is any filler material that bonds easily to standard materials used for leadframes for forming the leads and the die pad, such as metals including copper and copper alloys. For instance, in one embodiment the leads and die pad are made of copper and the filler material 32 is Cu/Sn, which readily bonds to the surface of the leads 18 in the recess 26.

Figure 3C:
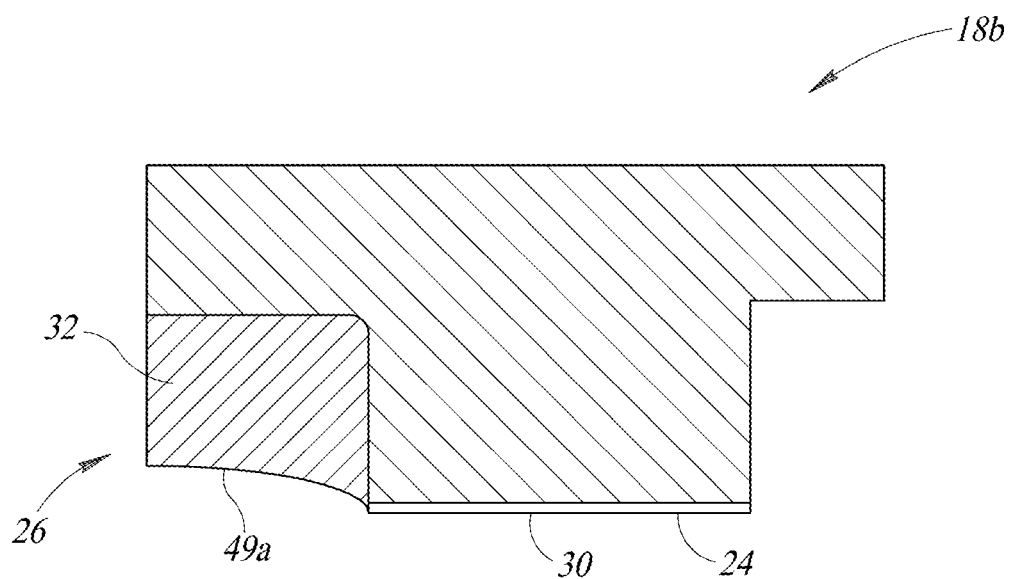

FIG. 3C illustrates a lead 18b that can be used in the package 10 of FIG. 1, in accordance with another embodiment. The lead 18b is substantially identical in function and structure to the lead 18a of FIG. 3B, except that the filler material 32 does not completely fill the recess 26. Although the filler material 32 substantially fills the recess 26, a lower surface 47a of the filler material 32 remains inside of the recess 26. In that regard, the conductive bumps 48 during mounting would also be provided into the recess 26 to possibly increase the bond between the package 10 and the PCB 46. In one embodiment, the lower surface 47a of the filler material 32 is concave shaped.

Figure 3D:
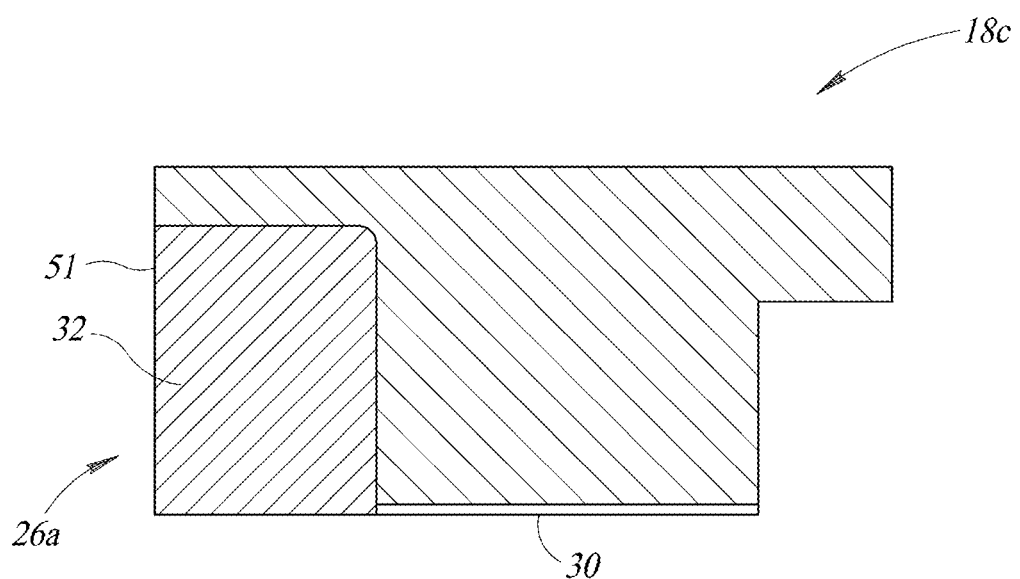

FIG. 3D illustrates a lead 18c that can be used in the package 10 of FIG. 1 in accordance with yet another embodiment. The lead 18c is substantially identical in function and structure to the lead 18a of FIG. 3B, except that a recess 26a of FIG. 3D extends farther into the lead 18c than the recess 26 extends into the lead 18a. That is, the recess 26a of FIG. 3D has a greater vertical depth than the recess 26 of FIG. 3D. The filler material 32 fills the recess 26 and, thus, has a larger side surface 51 than in the embodiments of FIGS. 3A-3C. In that regard, the larger side surface 51 provides greater surface area for the conductive bumps 48 for enabling the conductive bumps 48 to flow along during the mounting process. Thus, the larger side surface 51 may provide improved visual inspection of the joint between the package 10 and PCB 46 after mount.

Although not shown, it is to be appreciated that various features of the leads 18, 18a, 18b, 18c may be combined in other embodiments. For instance, the embodiments of FIGS. 3B-3D may include the conductive layer 30 in the recess 26.

Figure 4D:
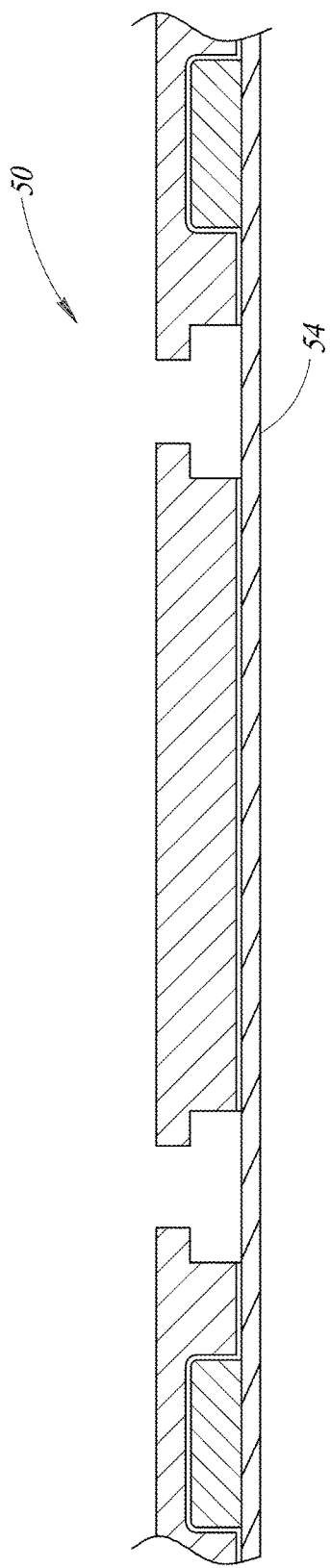
Figure 4E:
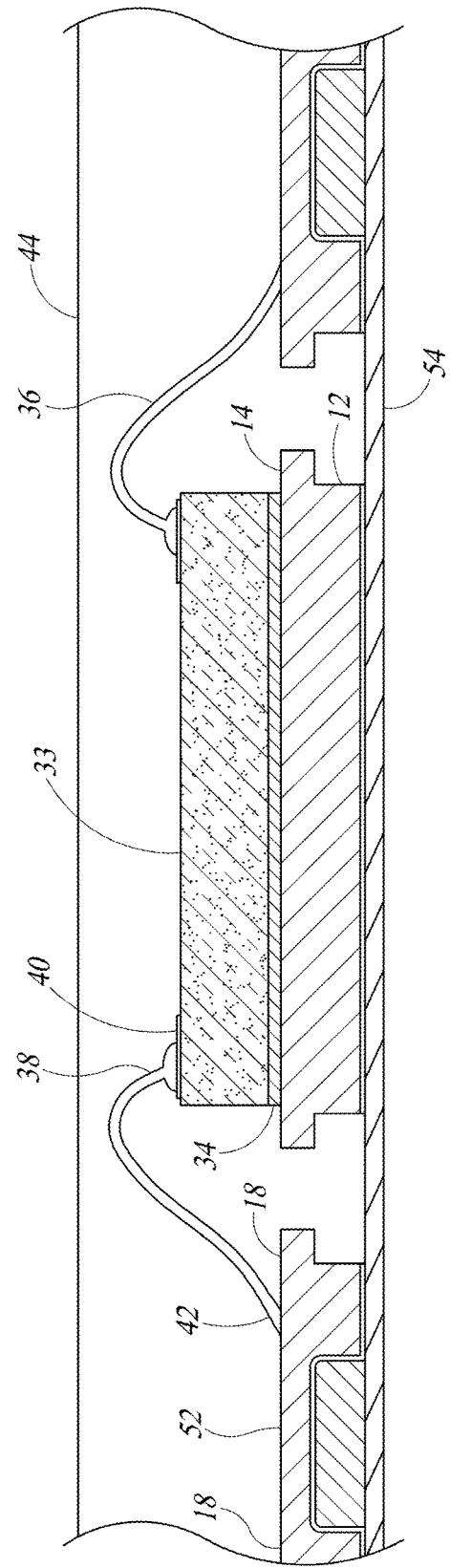
Figure 4F:
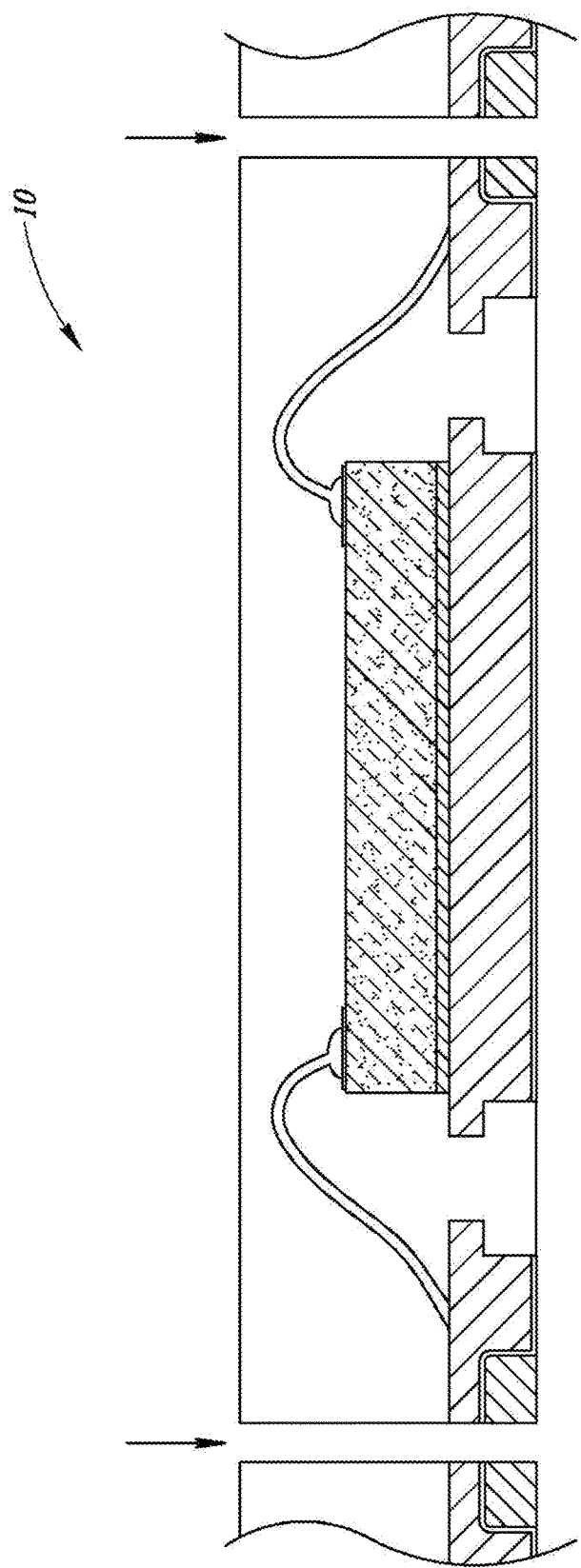

FIGS. 4A-4E illustrate various stages of manufacturing of the package 10 of FIG. 1, in accordance with one embodiment. In particular, FIGS. 4A-4C illustrate various stages of manufacturing a leadframe strip 50 and FIGS. 4D-4E illustrate various stages of manufacturing packages 10 with the leadframe strip 50.

As shown in FIG. 4A shows a portion of a leadframe strip 50. The leadframe strip 50 is a conductive material, such as metal, and in some embodiments is made of copper or a copper alloy. The leadframe strip 50 is formed to have a plurality of die pads 12, leads 18, connecting bars 52 that couple adjacent leads 18 together, and tie bars (not shown) that couple the die pads 12 to the leads 18, as is well known in the art.

Recesses 26 are formed in the lower surface 24 of the leads 18 and are formed using standard semiconductor processing techniques, including patterning with light sensitive materials and etching techniques. As mentioned above, the recesses 26 may be formed to extend about half way or more through the thickness of the leads 18. As best shown in FIG. 4A, the recesses 26 form the connecting bar 52 between adjacent leads 18.

As shown in FIG. 4B, the conductive material 30, if used, is deposited, such as by plating techniques, on lower surfaces of the leadframe strip 50. The conductive material 30 may be deposited on the surfaces in the recesses 26 as is shown in the illustrated embodiment. For the embodiments of FIGS. 3B-3D, however, the conductive material would not be deposited in the recesses. Although not shown, in some embodiments conductive material may also be deposited on upper surfaces of the leadframe strip.

As shown in FIG. 4C, the filler material 32 is deposited in the recesses 26. The filler material 32 may be deposited by any technique. In some embodiments, some or all of the lower surface of the leadframe strip 50 may be surface treated after depositing the filler material 32 in the recesses 26. For instance, the surface treatment may including grinding, chemical-mechanical polishing, etching or any other surface treating method of the filler material 32 and in some embodiments may include the treating the lower surfaces of the leadframe strip 50. In some embodiments, deposition of the filler material 32 or surface treatment of the filler material 32 is performed so that the filler material is coplanar with the lower surface 24 of the lead 18, or so that the filler material is recessed below the lower surface 24 of the leads 18. In that regard, in some embodiments the filler material 32 is deposited so that it does not fill the recesses 26.

As shown in FIG. 4D, in some embodiments the leadframe strip 50 may be secured to a substrate material 54, such as tape, to provide support for the leadframe strip 50 during subsequent processing. It is to be appreciated that the substrate material may also have been provided on the upper surface of the leadframe strip to provide support during any of the steps shown in FIGS. 4A-4C.

As shown in FIG. 4E, semiconductor die 33 are attached to the upper surfaces 14 of the die pads 12 by an adhesive material 34 using known package assembly techniques. Conductive wires 36 are coupled between pads 40 of the semiconductor die 33 and adjacent leads 18. That is, a first end 38 of the conductive wire 36 is coupled to a pad 40 of the die 33 and a second end 42 of the conductive wire 36 is coupled to the lead 18.

Encapsulation material 44 is formed over the upper surfaces of the leadframe strip 50 so that the encapsulation material 44 surrounds the die 33, the conductive wires 36, and upper surfaces of the leadframe strip 50. The encapsulation material 44 is also formed over the connecting bars 52, the leads 18, and the die pad 12. The encapsulation material 44 may be formed on the leadframe strip 50 by conventional techniques, for example by a molding process, and in some embodiments is hardened during a curing step.

The manufacturing process further includes separating each package into individual packages 10 as shown in FIG. 4E. In particular, the packages 10 are separated by dicing through the connecting bars 52, the filler material 32 in the recesses 26, and encapsulation material 44 located above the connecting bars 52. The packages 10 can be separated by various dicing methods, including saw and laser. The saw blade or laser used for separating the packages 10 has a cutting width that is less than a width of the connecting bars 52 such that each lead 18 includes a recess 26 filled with the filler material that is provided with each package 10. Although not shown, the leadframe strip 50 may be secured to a support structure, such as tape, during the dicing step as is well known in the art.

Figure 5A:
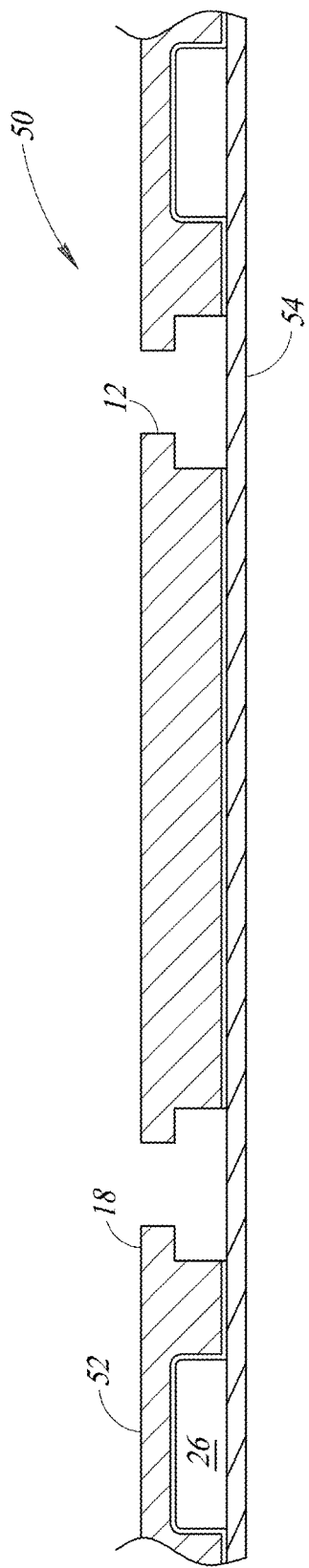
Figure 5B:
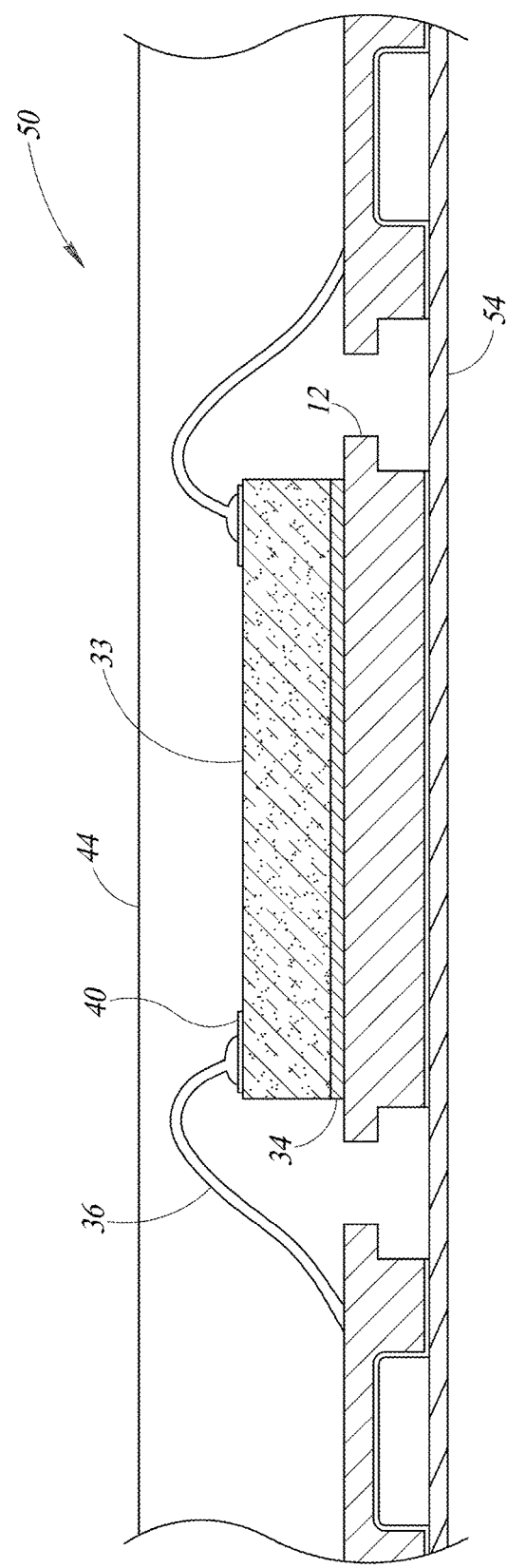
Figure 5E:
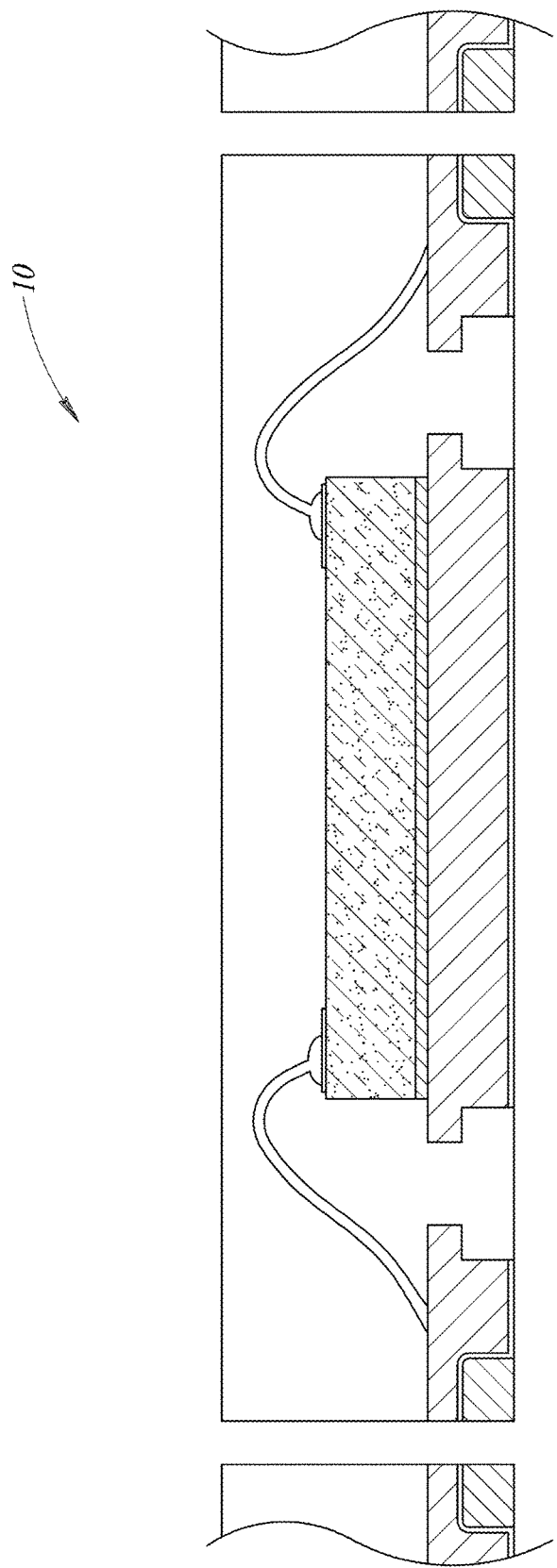

FIGS. 5A-5E illustrate various stages of manufacturing of the package 10 of FIG. 1 in accordance with another embodiment. The manufacturing steps are substantially identical to the manufacturing steps of FIGS. 4A-4E, however, some of the steps are performed in a different order. The leadframe strip 50 includes adjacent leads 18 having recesses 26 that are coupled together with connecting bars 52. The leadframe strip 50 may be provided on a substrate material 54. As shown in FIG. 5B, the semiconductor die 33 are secured to the die pad 12, the conductive wires 36 are coupled between the pads 40 of the die 33 and the leads 18, and the encapsulation material is formed prior to filling the recesses 26 of the leadframe strip 50.

As shown in FIG. 5C, the substrate material 54, if used, is removed, exposing the recesses 26. As shown in FIG. 5D, the recesses 26 are filled with filler material 32. As discussed above, the filler material 32 or the lower surface of the leadframe strip 50 may be surface treated. As shown in FIG. 5D, a dicing step is performed to separate each package into individual packages 10.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
    a semiconductor package including:
        a die pad having first and second surfaces;
        a semiconductor die coupled to the first surface of the die pad;
        a plurality of leads located near and spaced apart from the die pad, an outer surface of each of the plurality of leads including a recess; and
        a conductive filler material located in the plurality of recesses;
    a substrate having plurality of conductive pads; and
    conductive bumps coupling the leads of the semiconductor package to pads of the substrate, the conductive bumps coupled to the conductive filler material, the conductive bumps including one or more materials that are distinct from one or more materials of the conductive filler material.

2. The electronic device of claim 1, further comprising encapsulation material located over the semiconductor die and a portion of the plurality of leads.

3. The electronic device of claim 1 wherein the conductive bumps are a first solder material and the filler material is a solder material.

4. The electronic device of claim 3 wherein the first solder material is one of Sn/Pb, Ag, Sn/Bi, and Cu/Sn.

5. The electronic device of claim 1 wherein the substrate is a printed circuit board.

6. A semiconductor package, comprising:
a die pad having first and second surfaces;
a semiconductor die coupled to the first surface of the die pad;
a plurality of leads located near and spaced apart from at least one side of the die pad, the plurality of leads having outer surfaces that forms a portion of an outer surface of the semiconductor package;
the plurality of leads having recesses, respectively;
conductive filler material located in the recesses of the plurality of leads, the conductive filler material being electrically isolated from other electrical components that are external to the package; and
encapsulation material located over the semiconductor die and a portion of the plurality of leads.

7. The semiconductor package of claim 6 wherein the recess extends across an entire width of the lead.

8. The semiconductor package of claim 6 wherein the filler material is a solder material.

9. The semiconductor package of claim 8 wherein the solder material is one of Cu/Sn, Sn/Pb, Ag, and Sn/Bi.

10. The semiconductor package of claim 6 wherein the filler material has a first surface and the encapsulation material has a third surface, the third surface being substantially coplanar with the first surface of the filler material.

11. The semiconductor package of claim 6 wherein the filler material has at least one of a surface that is concave shaped and recessed lower than a second surface of the die pad.

12. The semiconductor package of claim 6 wherein the recesses extends more than half way through the plurality of leads.

13. The semiconductor package of claim 6, further comprising a wire bond electrically coupling a bond pad of the semiconductor die to the one of the plurality of leads.

14. The semiconductor package of claim 6 wherein the plurality of leads include a conductive layer comprising one of Au, Ag, Ni/Pd/Ag, Ni/Pd/Au—Ag alloy, and Ni/Pd/Au/Ag in the recesses and the filler material is located on the conductive layer.

15. The semiconductor package of claim 6 wherein the conductive filler material completely fills the recesses.

16. The semiconductor package of claim 15 wherein the conductive filler material has a first surface that is coplanar with the second surface of the die pad.

17. An assembly comprising:
a semiconductor package including:
a die pad having first and second surfaces;
a semiconductor die coupled to the first surface of the die pad;
a plurality of leads having recesses; and
a conductive filler material filling the plurality of recesses;
a substrate having plurality of conductive pads; and
conductive bumps coupling the leads of the semiconductor package to pads of the substrate, the conductive bumps coupled to the conductive filler material at a joining surface, the conductive bumps including a material that is different from at least one material of the conductive filler material.

18. The assembly of claim 17, wherein the conductive bumps are made of one of Cu/Sn, Sn/Pb, Ag, and Sn/Bi.

19. The assembly of claim 17, wherein the conductive filler material is made of one of Cu/Sn, Sn/Pb, Ag, and Sn/Bi.

20. The assembly of claim 17, wherein the conductive bumps are made of a first solder and the conductive filler material are made of a second solder.

* * * * *